United States Patent [19]
Nowatski et al.

[11] Patent Number: 5,552,749
[45] Date of Patent: Sep. 3, 1996

[54] METHOD FOR AUTOMATICALLY COMPENSATING FOR ACCURACY DEGRADATION OF A REFERENCE OSCILLATOR

[75] Inventors: Thomas M. Nowatski, Ft. Lauderdale; Keith I. Zambrano, Delray Beach, both of Fla.

[73] Assignee: Motorola, Inc., Schaumburg, Ill.

[21] Appl. No.: 494,462

[22] Filed: Jun. 26, 1995

[51] Int. Cl.[6] .................................. H03L 7/06; H04B 1/40
[52] U.S. Cl. .................... 331/14; 331/16; 331/18; 375/344; 455/76; 455/183.2; 455/192.2; 455/260
[58] Field of Search .................. 331/14, 16, 18; 375/344, 376; 455/71, 75, 76, 182.2, 183.2, 192.2, 259, 260

[56] References Cited

U.S. PATENT DOCUMENTS

| | | | |
|---|---|---|---|
| 4,492,933 | 1/1985 | Grieco | 331/66 |
| 5,041,799 | 8/1991 | Pirez | 331/44 |
| 5,063,357 | 11/1991 | Williams et al. | 331/49 |
| 5,113,416 | 5/1992 | Lindell | 331/69 |
| 5,170,492 | 12/1992 | Moller et al. | 331/17 |

*Primary Examiner*—Siegfried H. Grimm
*Attorney, Agent, or Firm*—Andrew S. Fuller

[57] ABSTRACT

A method for automatically compensating for accuracy degradation of the reference oscillator (170) is provided for a communication device (100). The communication device (100) is programmed with a first frequency value to detect a target carrier signal (310), and is reprogrammed with a second frequency value that is offset from the first frequency value by a particular offset factor, when the target carrier signal is not detected (320, 410). An available carrier signal is subsequently detected and its relative location information determined (420, 430, 440). The communication device is automatically adjusted to detect the target carrier signal using information derived from the relative location information and the particular offset factor (450, 460, 470, 480).

15 Claims, 5 Drawing Sheets

METHOD FOR AUTOMATICALLY COMPENSATING FOR ACCURACY DEGRADATION OF A REFERENCE OSCILLATOR

TECHNICAL FIELD

This invention relates in general to reference oscillators, and more specifically to the ability to compensate for performance degradation of an oscillator circuit which is due to the environment as well as other factors.

BACKGROUND OF THE INVENTION

Many modern electronic circuits or systems require the use of a reference oscillator which is capable of maintaining a relatively precise frequency output over wide environmental conditions. For example, a radio may use a reference oscillator for receiver operations. Here, the radio bases its operation on a carrier frequency that is output by a central control system, such as a base station. The accuracy of an oscillator circuit may depend on a variety of factors. These factors include the component tolerance of a crystal or other part used in the reference oscillator, the effect of temperature, humidity, and other environmental factors such as shock upon the oscillator circuit. Accuracy also depends on the effects of degradation of the oscillator circuit over time, commonly referred to as "aging". Ordinarily, an oscillator circuit requiring a precise frequency output, is built using components having high accuracy tolerances. Accuracies are usually expressed in terms of parts per million or billion with respect to the operating frequency. For example, components, or circuits, characterized by a low part per million (PPM) accuracy is typically much more expensive than those having a higher PPM accuracy. Depending on the application, circuit components are chosen based on their price/performance characteristics.

Regardless of the components chosen, an oscillator circuit will typically have variations in performance because of the environment and other factors. One example, is the degradation in performance due to changes in temperature. Compensation circuits such as that described in U.S. Pat. No. 4,492,933, issued to Grieco on Jan. 8, 1985, for a Temperature Compensation Circuit for Oscillator With Parabolic Characteristics, can be used to improve the accuracy of the oscillator circuit. Other temperature compensating circuits are well known in the art. A temperature compensation circuit usually requires a temperature sensor, and access to information regarding the temperature sensitivity of the oscillator components.

Oscillator circuits also degrade over time because of the effects of aging. The factors affecting age-based accuracy degradation are varied and include cumulative errors resulting from repeated mechanical stresses to the electronic circuit, degradation of materials used within the circuit to affix the components, temperature cycles, vibration, among others. Thus, the effect of aging on a particular oscillator circuit tends to be random and cannot be easily predetermined.

Prior art approaches to the handling of the effects of aging on an oscillator circuit are usually complex and difficult to implement. For receiver type applications, many approaches to compensate for the effects of aging use automatic frequency control which is generally ineffective once the oscillator circuit has degraded outside a particular error detection window. In such cases, the receiver is typically manually tuned or repaired before normal operations can resume.

A radio receiver that depends on access to a particular carrier frequency for proper operation may be inoperable when a reference oscillator, used to determine the frequency of communication signals, has degraded beyond basic error detection capabilities typically associated with automatic frequency control. It is desirable to have a process whereby the radio receiver can self-calibrate automatically to account for such degradation.

DETAILED DESCRIPTION OF THE PREFERRED EMBODIMENT

Figure 1:
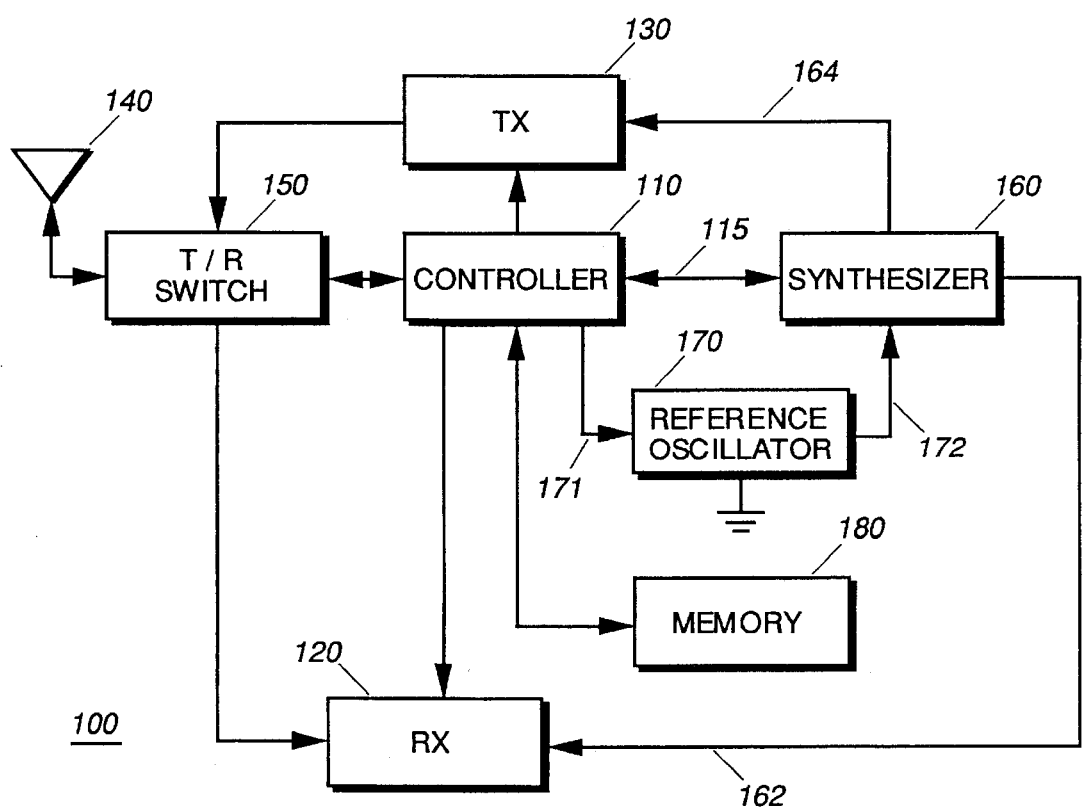
FIG. 1 is a block diagram of a radio incorporating reference oscillator accuracy degradation compensation, in accordance with the present invention.

While the specification concludes with claims defining the features of the invention that are regarded as novel, it is believed that the invention will be better understood from a consideration of the following description in conjunction with the drawing figures, in which like reference numerals are carried forward.

Generally, the present invention provides automatic compensation for accuracy degradation of a reference oscillator, such as that used in a receiver for a communication device. The present invention is particularly useful for accuracy degradation due to the effects of aging on the components of the reference oscillator. In operation, the receiver is programmed to detect a target carrier signal. When the target carrier signal is not detected within a corresponding detection window, the detection window is offset to the left or right by a particular offset factor by reprogramming the receiver. When an available carrier signal is detected, its frequency location relative to the originally programmed target carrier signal is determined. The receiver is then automatically adjusted to detect the target carrier signal using adjustment information derived from the relative carrier frequency location information of the available carrier signal. Preferably, a correction factor due to aging or the like is extracted from the adjustment information and used to update the reference oscillator start value. The corrected start value is stored for future operations of the receiver.

FIG. 1 is a block diagram of a radio 100 that incorporates the reference oscillator accuracy degradation compensation procedure, in accordance with the present invention. The radio 100 is a communication device, capable of digital or analog operation, that operates within a radio communication system (not shown) under a particular communication protocol. This communication protocol requires access to one or more carrier signals, commonly referred to as control channels, for basic operations. The radio 100 has a well-known frequency synthesized two-way radio design, and operates under the control of a controller 110. The radio 100 includes a receiver 120 and a transmitter 130, which receive and transmit radio frequency (RF) signals via an antenna 140. The antenna 140 is appropriately switched between the receiver 120 and the transmitter 130 by an antenna switch 150. The radio 100 also includes a well-known phase lock loop synthesizer 160, which under the control of the controller 110, provides a receiver local oscillator signal 162 and a transmitter local oscillator signal 164. A reference oscillator 170 provides a reference oscillator signal 172 for the synthesizer 160. The reference oscillator signal 172 is temperature compensated according to well known principles, such as that described in U.S. Pat. No. 5,041,799 mentioned above. The radio also includes memory 180 which contains routines and storage that implement the accuracy degradation compensation procedure for the reference oscillator, according to the present invention.

Figure 2:
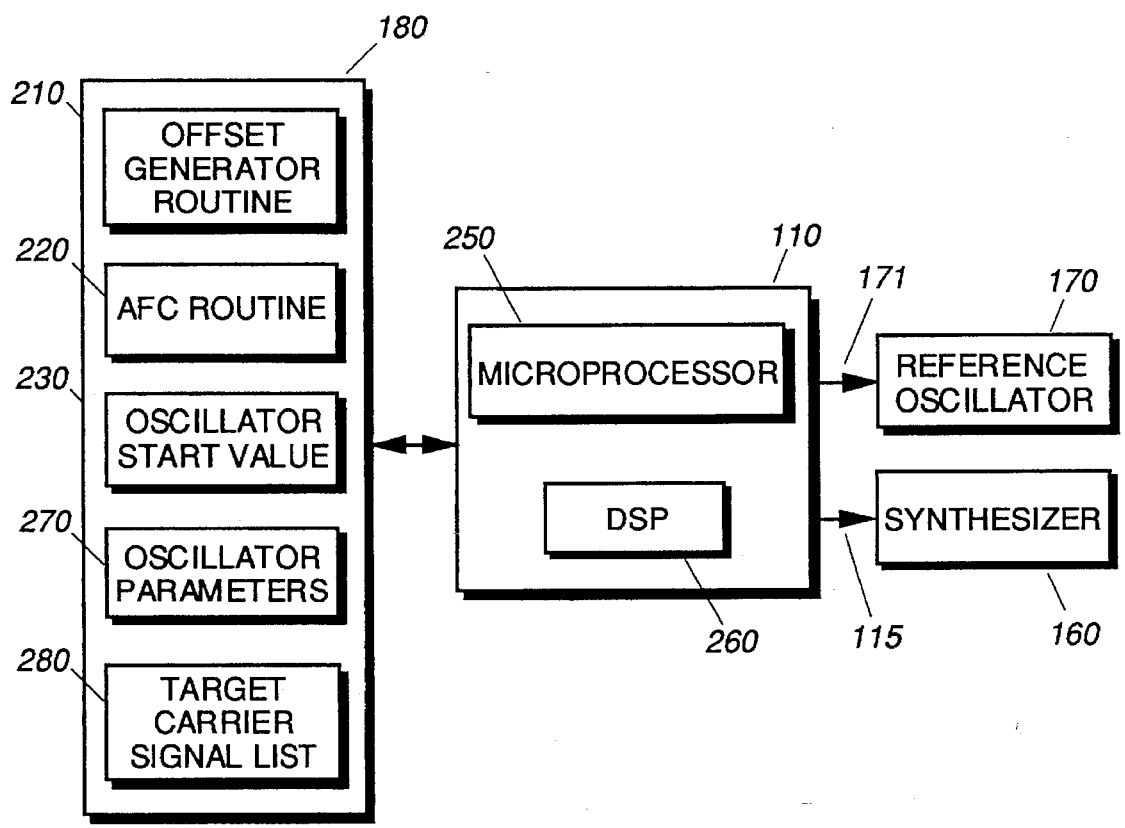
FIG. 2 is a block diagram highlighting some functional components for accuracy degradation compensation, in accordance with the present invention.

Referring to FIG. 2, a block diagram 200 highlighting some functional components for the accuracy degradation compensation process is shown, in accordance with the present invention. The memory 180 includes, without limitation, an offset generator routine 210, an automatic frequency control (AFC) routine 220, an oscillator start value storage location 230, and a target carrier signal list 280. In the preferred embodiment, the oscillator start value storage location 230 comprises non-volatile memory. The controller 110 also has access to some characteristic parameters 270 for the reference oscillator 170, preferably stored in the memory 180. One characteristic parameter is the maximum set accuracy error of the reference oscillator. The set accuracy is the initial frequency error attributable to manufacturing process variation to the reference oscillator. Another characteristic parameter is the maximum error known to be attributable to temperature variation and/or other environmental factors. Accordingly, the controller 110 has access to errors known to be inherent for the reference oscillator. The controller 110 includes a microprocessor 250 operating in tandem with a digital signal processor (DSP) 260. The controller 110 interacts with the memory 180 to determine programming values 171 for the reference oscillator 170 and programming values 115 for the synthesizer 160.

The AFC routine 220 is invoked by the controller 110 each time an available carrier signal is detected. The DSP 260 works in conjunction with the microprocessor 250 to calculate the difference in frequency between the programmed receiver frequency and the frequency of the detected available carrier signal. The frequency error is determined by extracting relative frequency information from the detected available carrier signal, which is assumed to be transmitted at an accurate frequency. The receiver is then centered onto the available carrier by moving the reference oscillator 170 a determined amount in the proper direction. This adjustment can be based on the frequency step size of the reference oscillator 170, which is preferably stored as one of the oscillator parameters 270 in the memory 180.

The offset generator routine 210 steps the reference oscillator 170 a predetermined amount away from the oscillator start value 230 to increase or decrease the frequency value of its output. This results in the movement of the receiver's detection window to the left or right of the oscillator's start value 230 in an attempt to detect an available carrier. The size of the offset is chosen to ensure that the entire channel space will be traversed when in the offset generator routine 210. If the entire channel space has been traversed and no carriers have been found, then the offset generator 210 switches control back to the controller 110 to enable programming of a new target carrier signal. The offset generator routine 210 is executed for each carrier corresponding to the target carrier signal list 280, until either an available carrier is detected or the target carrier signal list is exhausted.

Figure 3:
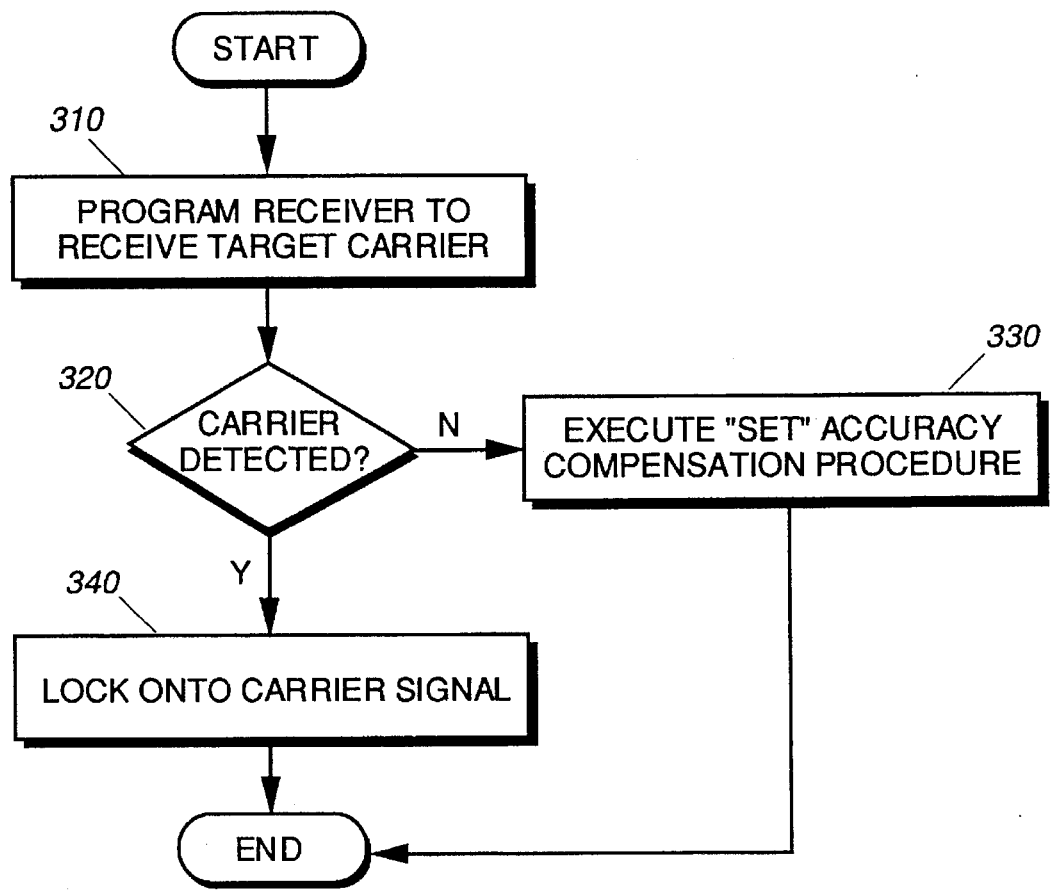
FIG. 3 is a flowchart of procedures used in the radio when attempting to access a carrier signal, in accordance with the present invention.

FIG. 3 is a flowchart of procedures 300 used by the radio when attempting to receive a particular target carrier signal, in accordance with the present invention. The radio controller 110 programs the receiver with a first frequency value corresponding to a particular target carrier signal, step 310. Ordinarily, the receiver is able to detect the target carrier signal, when the target carrier signal is available and within communication range, step 320. However, it is possible that the receiver is unable to detect the target carrier signal. At least three possibilities arise: (1) the radio is out of range of the source of the target carrier signal; (2) the target carrier signal is not being transmitted; and (3) the accuracy of the reference oscillator has degraded beyond an error detection window, and thus cannot be corrected solely by the AFC routine. When accuracy degradation of the reference oscillator is responsible for the inability to detect the target carrier signal, the radio executes the accuracy compensation procedure of the present invention, which automatically adjusts or calibrates the radio receiver to enable detection of the target carrier signal, steps 320, 330. The radio receiver locks onto the target carrier signal, when detected, and switches control back to the controller for further signal processing, step 340.

Figure 4:
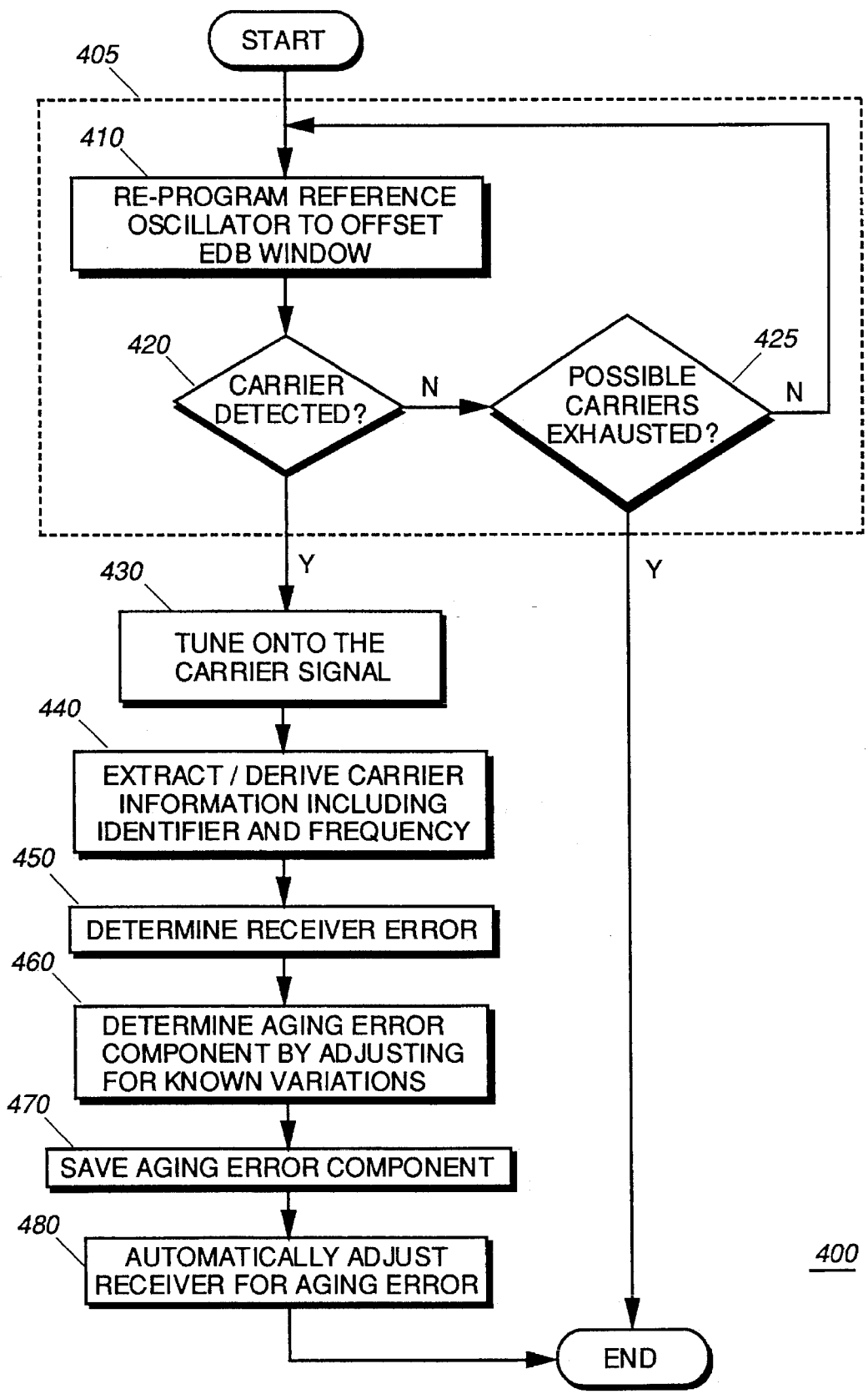
FIG. 4 is a flowchart of procedures used in the radio to automatically compensate for accuracy degradation, in accordance with the present invention.

FIG. 4 is a flowchart of procedures 400 used in the radio to automatically compensate for accuracy degradation, in accordance with the present invention. The compensation procedure determines when the accuracy of the reference oscillator has degraded past a specific point, beyond which, the AFC routine is no longer able to lock the radio receiver onto a carrier signal for normal radio operations. Ordinarily, upon start up such as when the radio is turned on, the reference oscillator is programmed with the oscillator start value 230. This start value determines the frequency at which the reference oscillator operates. When the reference oscillator is operating within predefined tolerances, the receiver can detect the target carrier signal within a particular detection window, herein referred to as an error detection bandwidth (EDB). If the target carrier signal is present within the EDB, the receiver is able to lock onto the carrier signal using the AFC routine 220. However, the accuracy of the reference oscillator may be degraded such that an available target carrier signal is no longer detectable within the EDB. In such case, the radio attempts to locate an available carrier signal, and uses this available carrier signal to generate parameters to automatically compensate for the accuracy degradation of the reference oscillator.

The radio enters a search mode 405 in which the EDB is successively offset left or right of the first frequency value programmed to detect the target carrier signal. Accordingly, when the target carrier signal is not detected, the receiver is reprogrammed with a second frequency value that is offset from the first frequency value by a particular offset factor, step 410. The reprogramming of the receiver operates to search outside the EDB corresponding to the first frequency value to determine whether there is an available carrier signal. Preferably, data corresponding to the first frequency value is programmed within the synthesizer 160 to set the receiver to detect the target carrier signal. However, when the receiver is reprogrammed with the second frequency value that is offset by the particular offset factor, the programming is done via the reference oscillator to provide more precise control of the incremental change to the frequency value programmed in the receiver. For example, assume that the channel spacing of the system is 10 KHz wide. The controller 110 determines after exhausting the target carrier signal list that the offset generator routine is needed. The start value 230 of reference oscillator will then be offset 5 KHz (50 steps in the preferred embodiment) to the right and left of each target carrier signal until either an available carrier is found or the list is exhausted.

In the preferred embodiment, a search is conducted to cover all carriers of the system in which the radio operates in order to determine whether an available carrier signal exists, steps 410, 420, 425. If no available carrier signal is detected, then it is assumed that the radio is out of range of a carrier signal and no permanent adjustment is made. During the search for an available carrier, the receiver is successively reprogrammed with a frequency value that is offset from the original frequency value by a particular offset factor, such as 5 KHz in the above example. Generally, when the inability to detect the carrier signal is based on component aging within the reference oscillator, an available carrier signal will be detected when the receiver is reprogrammed with a particular frequency value that is incrementally shifted from the originally programmed value, i.e., the first frequency value. The receiver is then tuned as is normally done with the automatic frequency control/centering routine, steps 420, 430. Here, the tuning values necessary for frequency centering adjustment are determined by comparing the particular frequency value with the available carrier signal.

Once the receiver is centered on the available carrier signal, the configuration of the receiver is saved. The saved configuration includes information related to the synthesizer and reference oscillator programming values. Carrier identification information is extracted or otherwise determined from the available carrier signal, step 440. Carrier frequency information is derived using the carrier identification information, and the original frequency value that was programmed within the receiver to detect the target carrier signal, step 440. An overall error factor is determined from the difference between the carrier frequency for the available carrier signal and the first frequency value, while accounting for the offset factor or amount, and the frequency centering adjustment (tuning values), step 450. The overall error factor is calculated by knowing the reference oscillator start value, final value, step size, and offset factor. A correction factor, presumably attributable to the aging component, is then determined by adjusting the overall error factor for tolerances attributable to component manufacturing variation, also known as "set" accuracy, and environment induced variations, such as temperature variation with respect to the reference oscillator, step 460. In the preferred embodiment, errors attributable to known factors such as temperature and set accuracy are discounted or removed from the cumulative error factor to obtain the correction factor. Preferably, the known error factors are based on maximum errors for the reference oscillator attributable to set accuracy and temperature based variation. The following equation will help demonstrate the use of the maximum allowable set accuracy error, as well as the use of the maximum allowable error due to temperature variations:

Overall Error Factor=max (Set Accuracy)+max (Temperature Variation)+Aging

By using values for maximum error attributable to temperature variation, the use of a temperature sensor is obviated. For example, assume that the overall error factor, expressed in parts per million (PPM), is 8 PPM; the maximum temperature variation is 5 PPM; and maximum set accuracy is 0.25 PPM:

8 PPM=0.25 PPM+5 PPM+Aging; Aging=2.75 PPM

A correction factor of −2.75 PPM is derived from the error attributable to aging, and is applied to the radio to enable normal operation.

The correction factor is somewhat stable relative to such environmental variables such as temperature and the like. The correction factor is stored in non-volatile memory such as an electrically erasable programmable read only memory (EEPROM) for use in further radio operations, step 470. In the preferred embodiment, the oscillator start value 230 stored is automatically adjusted to reflect the correction factor for subsequent radio operations, step 480. The foregoing procedure is preferably implemented using software instructions, such as the offset generator routine 210 and the AFC routine 220, for the microprocessor 250 and/or the DSP 260.

Figure 5:
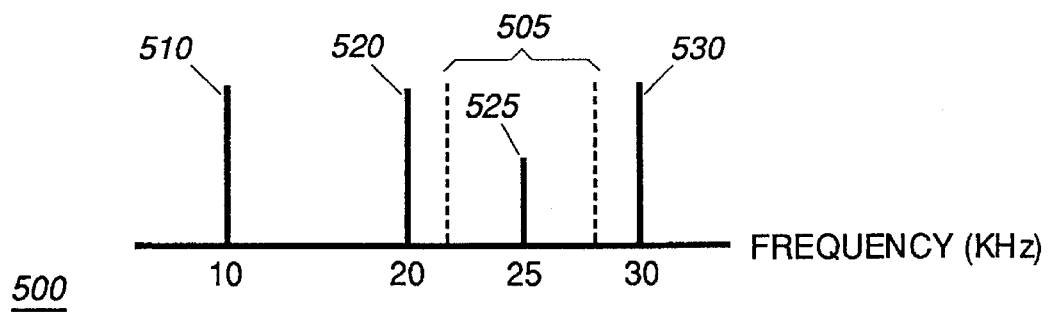
FIG. 5 is a graph showing relative frequency locations when attempting to access a carrier signal, in accordance with the present invention.
Figure 6:
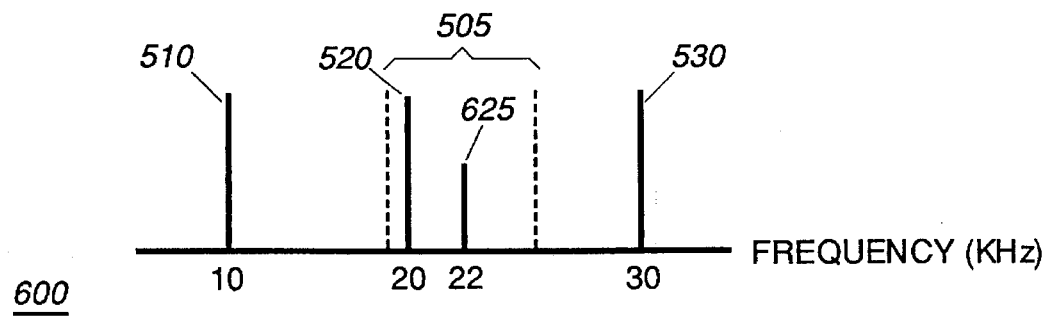
FIG. 6 is a graph showing relative frequency locations when adjusting to detect a carrier signal, in accordance with the present invention.

FIGS. 5 and 6 further illustrate operational aspects of the present invention. FIG. 5 is a graph 500 showing relative frequency locations when attempting to access a carrier signal; and FIG. 6 is a graph 600 showing relative frequency locations when adjusting the radio 100 to detect a carrier signal, in accordance with the present invention. In FIG. 5, the radio 100 operates within a radio communication system having available carrier signals 510, 520, 530 at corresponding carrier frequencies having a ten (10) kilohertz (KHz) channel spacing. However, the reference oscillator has degraded such that in an attempt to receive a target carrier signal 520, a corresponding programmed frequency value results in an actual receive frequency 525 at 25 KHz which is shifted from the target carrier frequency 520. The target carrier signal 520 is not within a predefined EDB 505 and is not detected. In FIG. 6, a second programmed frequency value due to the offset generator routine 210, results in an offset actual receive frequency 625 at 22 KHz. The EDB 505 is shifted to the left such that an available carrier frequency 520 is within the EDB.

To illustrate this point, assume a minus three (−3) KHz offset factor, a plus and minus three (+/−3) KHz EDB, a minus two (−2) KHz shift for frequency centering adjustments, and a maximum known error of two (2) KHz shift due to set accuracy and temperature variation. A correction factor can be calculated using the difference between the frequency information for the available carrier signal 520, and the receivers first frequency value 525:

Overall Error Factor=25 KHz−20 KHz=+5 KHz (from graph)

Using the equation for overall error factor from above:

5 KHz=2 KHz+Aging; Aging=3 KHz

Here, the correction factor would be equal to −3 KHz.

The present invention offers significant benefits over approaches found in the prior art. A reference oscillator used in a communication device or system requiring minimum frequency error is typically formed by using expensive parts. The present invention allows for the use of a less expensive design while providing a similar level of accuracy. Many prior art accuracy degradation compensation procedures are not functional when the reference oscillator has degraded beyond a particular point. The accuracy compensation process embodied herein extends the effective range of error correction. By extracting and saving the error component due to aging, the correction factor is generated only when needed and is available for automatically adjusting the reference oscillator in subsequent operations. The compensation procedure described herein does not require the use of a temperature sensor or the collection and storage of historical data to determine the correction factor like prior art techniques. Rather the invention allows for continuous operation of the radio until a significant amount of accuracy degradation has occurred that forces the radio outside the EDB. When this situation does occur the accuracy degradation compensation routine is invoked and the correction factor is determined. Preferably, the accuracy compensation routine is then disabled until the radio has again moved outside the EDB.

An additional benefit of this invention is that it also allows for the recovery of environmental factors such as shock or vibration that would ordinarily move the receiver outside of the EDB, and render the radio inoperable. The offset generator routine 210, moves the radio back into a detectable region, and recovers from the frequency shift effects due to such environmental factors.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. In a communication device having a reference oscillator, a method for automatically compensating for accuracy degradation of the reference oscillator, comprising the steps off programming the communication device with a first frequency value to detect a target carrier signal;

reprogramming the communication device with a second frequency value that is offset from the first frequency value by a particular offset factor, when the target carrier signal is not detected;

detecting an available carrier signal when the communication device is reprogrammed with the second frequency value;

determining relative location information for the available carrier signal; and automatically adjusting the communication device to detect the target carrier signal using information derived from the relative location information and the particular offset factor.

2. The method of claim 1, wherein the step of determining relative location information comprises the step of determining carrier frequency information using the available carrier signal.

3. The method of claim 2, wherein the step of determining carrier frequency information comprises the steps of:

determining carrier identification information from the available carrier signal; and deriving the carrier frequency information using the carrier identification information and the first frequency value.

4. The method of claim 2, wherein the step of automatically adjusting the communication device comprises the steps of:

determining a correction factor and adjusting for tolerances attributable to component variation and environment induced variation with respect to the reference oscillator; and storing the correction factor in non-volatile memory for use in adjusting the communication device.

5. The method of claim 4, wherein the step of determining a correction factor comprises the step of generating a frequency centering adjustment by comparing the second frequency value with the available carrier signal using an automatic frequency control circuit.

6. The method of claim 5, wherein the step of determining a correction factor further comprises the step of calculating the correction factor using the carrier frequency information, the first frequency value, the particular offset factor, and the frequency centering adjustment.

7. The method of claim 5, wherein the step of determining a correction factor comprises the steps of:

determining a cumulative error factor using the carrier frequency, the first frequency value, the particular offset factor, and the frequency centering adjustment; and discounting, from the cumulative error factor, errors attributable to known factors to derive the correction factor.

8. The method of claim 7, wherein the step of discounting comprises the step of adjusting the cumulative error factor based on maximum errors attributable to set accuracy and temperature based variation.

9. In a communication device having a receiver with a reference oscillator, a method for automatically compensating for accuracy degradation of the reference oscillator, comprising the steps of:

determining that the receiver cannot receive a target carrier signal when set with a first frequency value;

setting the receiver to receive a second frequency value that is offset from the first frequency value by a particular offset amount;

detecting an available carrier signal when the receiver is set to receive the second frequency value;

tuning the receiver to receive the available carrier signal using an automatic frequency control routine that generates a tuning value;

generating a correction factor for the receiver using in part the tuning value and the particular offset amount, including the steps of:

determining carrier frequency information for the available carrier signal;

determining a cumulative error factor using the carrier frequency information, the first frequency value, the particular offset amount, and the tuning value;

discounting, from the cumulative error factor, errors attributable to known factors including set accuracy and temperature based variation, to derive the correction factor;

storing the correction factor within the communication device; and automatically calibrating the receiver using the correction factor.

10. In a receiver having a reference oscillator, a method for automatically compensating for accuracy degradation of the reference oscillator, comprising the steps of:

setting the receiver to receive a target carrier signal within a first signal detect window;

detecting that the target carrier signal is not available within the first signal detect window;

offsetting the first signal detect window by a particular offset amount to provide a second signal detect window;

detecting when an available carrier signal is present within the second signal detect window;

determining relative location information for the available carrier signal; and automatically calibrating the receiver using information derived from the relative location information and the particular offset amount.

11. The method of claim 10, wherein the step of setting the receiver comprises the step of programming the receiver with a first frequency value corresponding to the target carrier signal.

12. The method of claim 11, wherein the step of offsetting the first signal detect window comprises the step of programming the receiver with a second frequency value that differs from the first frequency value by the particular offset amount.

13. The method of claim 12 wherein the step of determining relative location comprises the steps of:

determining carrier identification information from the available carrier signal; and deriving carrier frequency information using the carrier identification information and the first frequency value.

14. The method of claim 13, wherein the step of determining relative location information comprises the step of generating distance and direction information by comparing the carrier frequency information and the first frequency value.

15. The method of claim 14, wherein the step of automatically calibrating the receiver comprises the steps of:

generating a compensation value by adjusting for tolerances attributable to component variation and temperature variation of the reference oscillator; and storing the compensation value for use in adjusting the receiver.

* * * * *